United States Patent
Uno et al.

(10) Patent No.: US 8,115,231 B2
(45) Date of Patent: Feb. 14, 2012

(54) SEMICONDUCTOR DEVICE

(75) Inventors: Hirohiko Uno, Shiga (JP); Naoki Matsuura, Shiga (JP)

(73) Assignee: Renesas Electronics Corporation, Kanagawa (JP)

( * ) Notice: Subject to any disclaimer, the term of this patent is extended or adjusted under 35 U.S.C. 154(b) by 220 days.

(21) Appl. No.: 12/458,852

(22) Filed: Jul. 24, 2009

(65) Prior Publication Data
US 2010/0019274 A1    Jan. 28, 2010

(30) Foreign Application Priority Data

Jul. 28, 2008 (JP) .................................. 2008-193242

(51) Int. Cl.
*H01L 29/866*    (2006.01)
(52) U.S. Cl. ........ 257/106; 257/328; 257/355; 257/551; 257/603; 257/E29.335; 257/E27.016
(58) Field of Classification Search .................. 257/106, 257/328, 355, 551, 603, E29.335, E27.016
See application file for complete search history.

(56) References Cited

U.S. PATENT DOCUMENTS

| | | | | |
|---|---|---|---|---|
| 6,965,150 B2 * | 11/2005 | Higashida et al. | ............ | 257/356 |
| 2002/0050602 A1 * | 5/2002 | Narazaki | ....................... | 257/106 |

FOREIGN PATENT DOCUMENTS

| | | |
|---|---|---|
| JP | 2002-043574 A | 2/2002 |
| JP | 2002-118258 A | 4/2002 |

* cited by examiner

*Primary Examiner* — Jerome Jackson, Jr.
*Assistant Examiner* — Yu Chen
(74) *Attorney, Agent, or Firm* — Foley & Lardner LLP

(57) ABSTRACT

A semiconductor device includes an insulating film formed over a semiconductor substrate, a Zener diode formed above the insulating film, an interlayer film formed above the Zener diode, and a gate aluminum and a source aluminum formed above the interlayer film. The Zener diode is connected between the gate aluminum and the source aluminum. The Zener diode is formed by alternately joining an N type region and a P type region concentrically. The gate electrode includes a gate pad section. A planar shape of the Zener diode is substantially similar to a planer shape of the gate pad section. The gate pad section extends for a predetermined distance from an outermost edge of the P type region of the Zener diode to outside.

7 Claims, 7 Drawing Sheets

SEMICONDUCTOR DEVICE

BACKGROUND

1. Field of the Invention

The present invention relates a semiconductor device, and particularly to a semiconductor device such as a power MOSFET.

2. Description of Related Art

In a semiconductor device, such as a power MOSFET (Power metal oxide semiconductor field effect transistor), a gate resistance may be connected to a gate electrode in order to protect a thin gate oxide film. A Zener diode may be connected between the gate electrode and the source electrode to protect the gate oxide film.

For example, Japanese Unexamined Patent Application Publication No. 2002-118258 discloses a trench gate MOSFET. In the MOSFET disclosed in Japanese Unexamined Patent Application Publication No. 2002-118258, a drain region made of an N− type epitaxial layer is provided over an N+ semiconductor substrate, a P type channel layer is provided over the drain region, and a trench is provided in the P type channel layer. Further, a gate oxide film is provided over the P type channel layer, and a Zener diode is provided over the gate oxide film. The Zener diode is formed by alternately ion implanting an N type impurity and a P type impurity into a polysilicon layer. One end of the Zener diode is connected to a gate electrode, and the other end is connected to a source electrode. That is, the Zener diode is connected between the gate electrode and the source electrode. In the Zener diode, an N type semiconductor region doped with an N type impurity and a P type semiconductor region doped with a P type impurity are arranged alternately in a concentric manner. This allows an overvoltage applied between the gate electrode and the source electrode to escape, thereby avoiding to destroy the gate oxide film.

Meanwhile, the Zener diode connected between the gate electrode and the source electrode is often placed below the gate electrode for layout reasons. The configuration of the Zener diode is restricted by a voltage guaranteed value between the gate electrode and the source electrode (VGSS guaranteed value), a diameter of a gate wire, and a characteristic (boundary length) of a diode.

On the other hand, in the field of automotive semiconductors, the size of an electronic circuit to be mounted is increasing along with the progress of the electronic control. Therefore, there is not enough space to mount the electronic circuit inside the vehicle and the electronic devices need to be mounted inside the engine room. Thus, the automotive semiconductors are required for reliability of wider range of temperature. For example, the automotive semiconductors are required for reliability under high temperature of 175 degrees Celsius. Therefore, in the field of automotive power MOSFET, a high temperature reverse bias test is carried out at 175 degrees Celsius and 168 hours or more, for example.

However, when performing the high temperature reverse bias test to a power MOSFET disclosed in Japanese Unexamined Patent Application Publication No. 2002-118258, there was a problem that a leakage current between gate and source increases.

Accordingly, Japanese Unexamined Patent Application Publication No. 2002-043574 discloses a trench gate MOSFET in which two Zener diodes are connected in series between a gate electrode and a source electrode. This trench gate MOSFET attempts to reduce the leakage current by providing an N type semiconductor region between the two Zener diodes.

SUMMARY

However, the present inventors have found a problem that in the techniques disclosed in Japanese Unexamined Patent Application Publication Nos. 2002-118258 and 2002-043574, the N and P type semiconductor regions are formed concentrically in the Zener diodes. Thus the junction part of the N and P type semiconductor regions (the part hereinafter referred to as a PN junction part) is short. This increases the dynamic resistance of the Zener diodes. The large dynamic resistance reduces the voltage absorbing capability of the Zener diodes. This will also reduces the electrostatic breakdown tolerance of the Zener diodes.

A first exemplary aspect of an embodiment of the present invention is a semiconductor device that has an insulating film formed over a semiconductor substrate, a Zener diode formed above the insulating film, an interlayer dielectric formed above the Zener diode, and a gate electrode and a source electrode formed above the interlayer dielectric. The Zener diode is connected between the gate electrode and the source electrode. The Zener diode is formed by alternately joining an N type semiconductor region and a P type semiconductor region concentrically. The gate electrode includes a gate pad section. A planar shape of the Zener diode is substantially similar to a planer shape of the gate pad section. The gate pad section extends for a predetermined distance from an outermost edge of the P type semiconductor region of the Zener diode to outside.

In the first exemplary aspect of the embodiment of the present invention, the planar shape of the Zener diode is substantially similar to the planar shape of the gate pad section. Thus the PN junction part of the Zener diode is longer. This further reduces the dynamic resistance of the Zener diode. Accordingly, the voltage absorbing capability of the Zener diode can be improved. Further, this enables to increase the electrostatic breakdown tolerance of the Zener diode.

Moreover, in the first exemplary aspect of the embodiment of the present invention, the gate pad section extends for a predetermined distance from the outermost edge of the P type semiconductor region of the Zener diode to outside. That is, the upper part of the entire P type semiconductor region of the Zener diode is covered with the gate pad section. Therefore, when making the gate electrode and the source electrode to 0V and a voltage is applied to a drain electrode in order to carry out a high temperature reverse bias test, cations got into the gap between the gate electrode and the source electrode will not form an inversion layer over the surface of the P type semiconductor region. This enables to reduce the leakage current between the gate and source in the measurement after a high temperature reverse bias test.

The present invention enables to increase the electrostatic breakdown tolerance and reduce the leakage current between gate and source at a leakage measurement after the high temperature reverse bias test.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF THE EXEMPLARY EMBODIMENTS

The invention will now be described herein with reference to illustrative embodiments. Those skilled in the art will recognize that many alternative embodiments can be accomplished using the teachings of the present invention and that the invention is not limited to the embodiments illustrated for explanatory purposes.

Embodiments incorporating the present invention are described hereinafter. In the embodiments below, a power MOSFET is used for an example as a semiconductor device. However, the present invention is not limited to the following embodiments.

First Exemplary Embodiment

Figure 1:
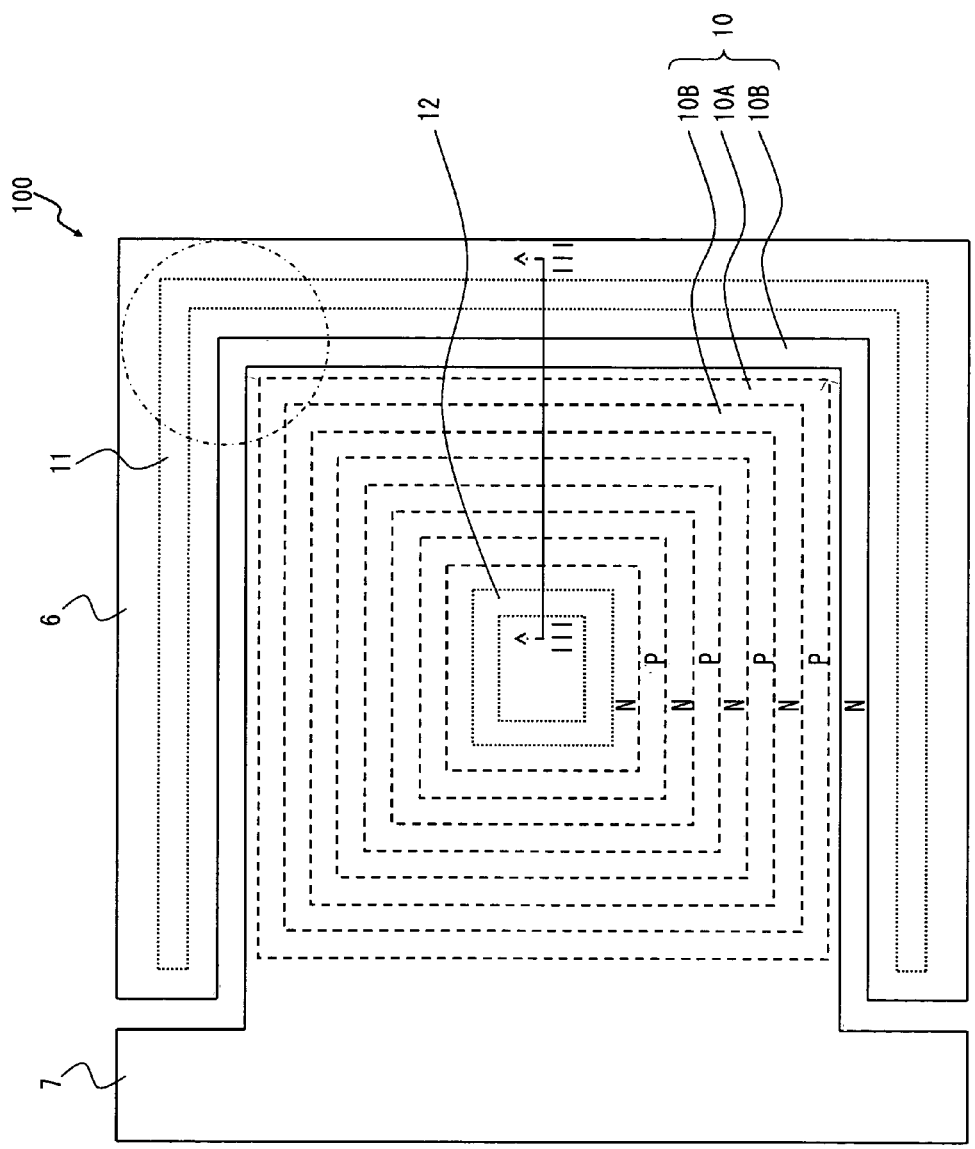
FIG. 1 is a planar view showing an example of a power MOSFET according to a first exemplary embodiment of the present invention.
Figure 3:
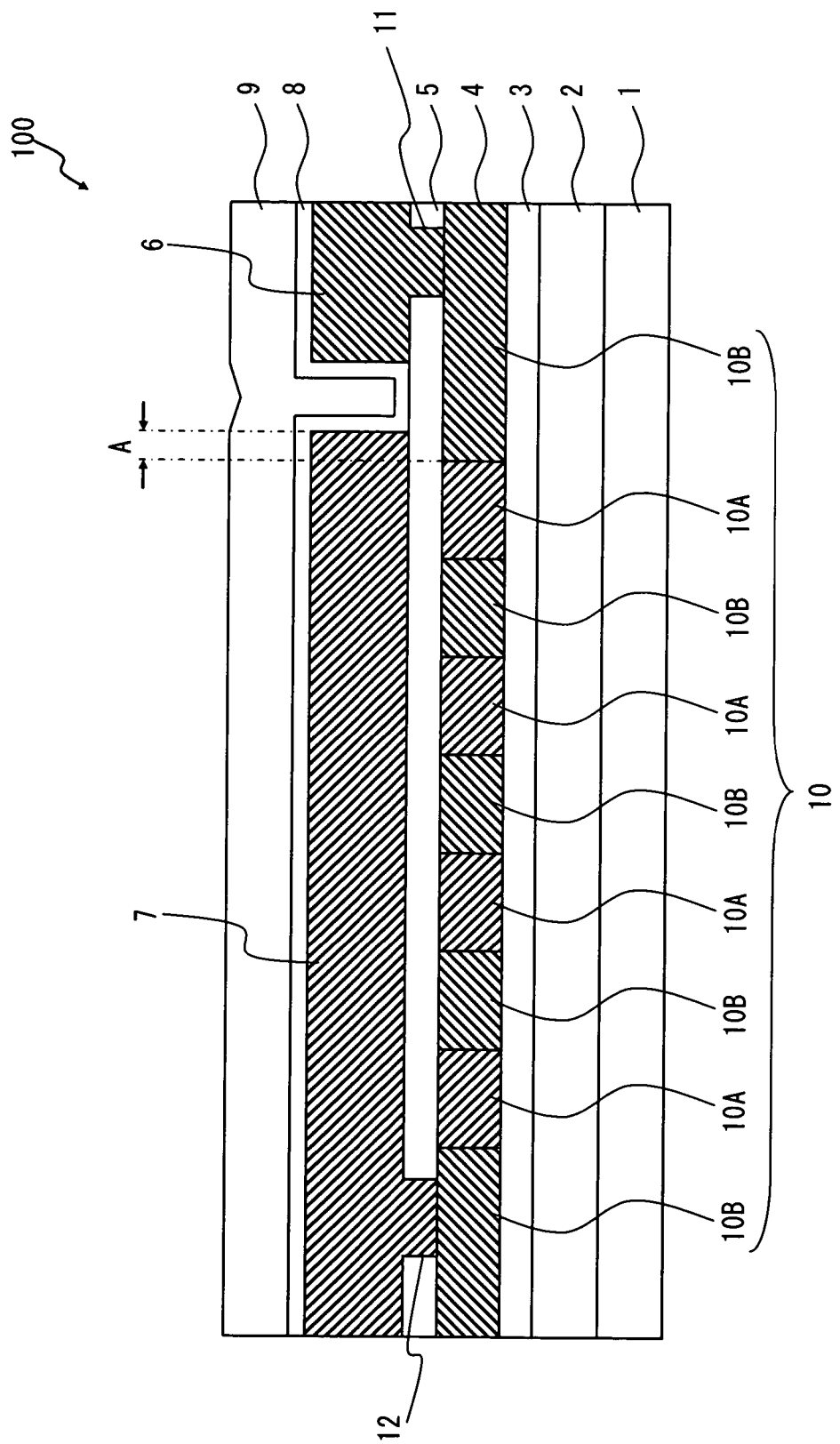
FIG. 3 is a cross-sectional view taken along the line III-III of FIG. 1.

FIG. 1 is a planar view showing a power MOSFET according to a first exemplary embodiment of the present invention. FIG. 3 is a cross-sectional view taken along the line III-III of FIG. 1.

As shown in FIG. 1, the power MOSFET 100 is formed as a substantially rectangular shape in planar view. Further, as shown in FIG. 3, the power MOSFET 100 includes an epitaxial layer 1, a well 2, an oxide film (insulating film) 3, a polysilicon layer 4, an interlayer film (interlayer dielectric) 5, a source aluminum (source electrode) 6, a gate aluminum (gate electrode) 7, a cover film 8, and a polyimide 9.

Figure 2:
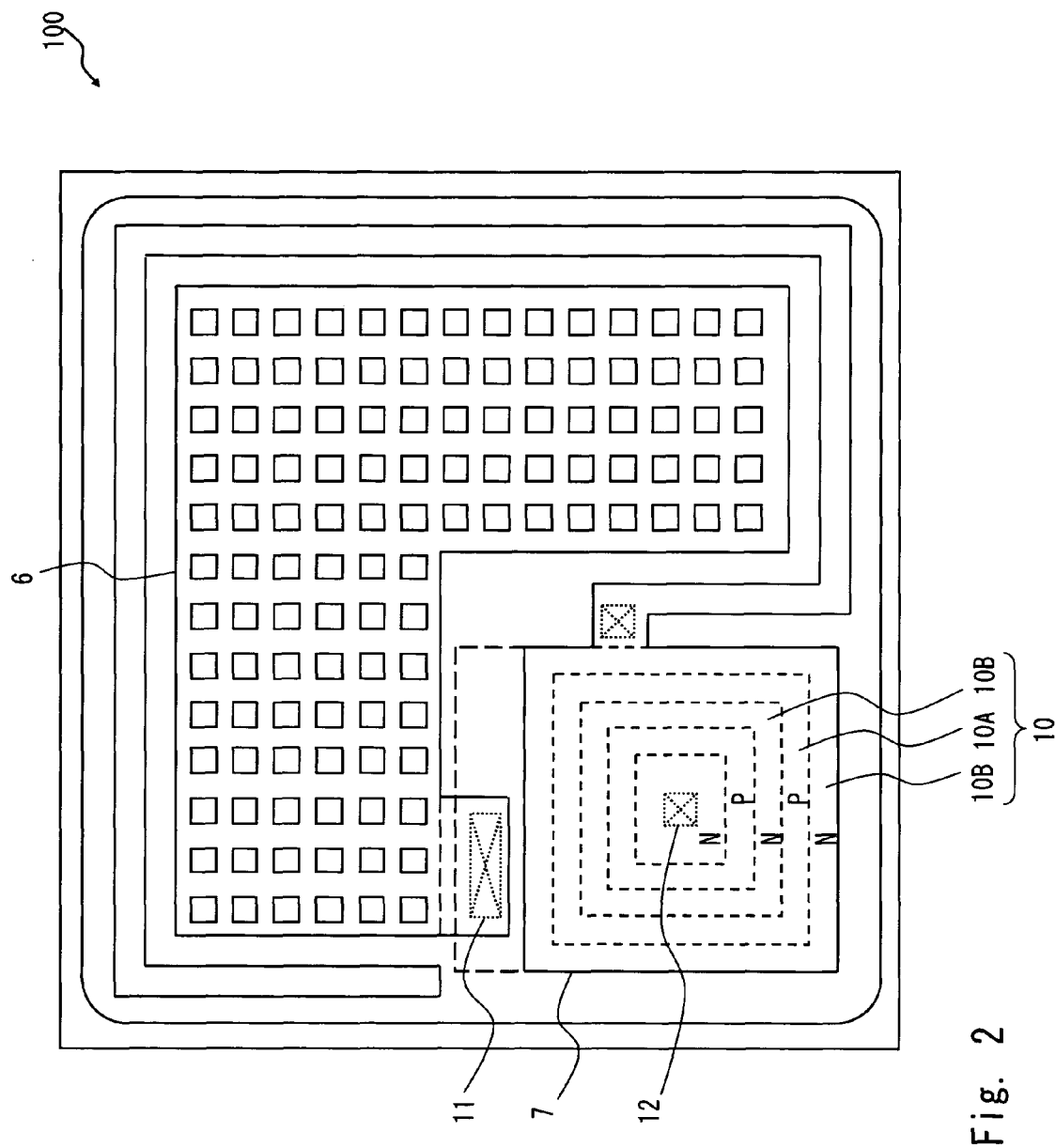
FIG. 2 is a planar view showing an example of the power MOSFET according to the first exemplary embodiment of the present invention.

As shown in FIG. 1, the gate aluminum 7 includes a gate pad section formed as a substantially rectangular shape in planar view. The source aluminum 6 is formed as a substantially U-shape in planar view to surround the gate pad section formed as a substantially rectangular shape in planar view of the gate aluminum 7. It is noted that as shown in FIG. 2, the source aluminum 6 may be formed as a substantially L-shape in planar view to surround the gate pad section formed as a substantially rectangular shape in planar view of the gate aluminum 7.

The Zener diode 10 is formed in the lower layer of the gate pad section formed as a substantially rectangular shape in planar view of the gate aluminum 7.

The planar shape of the Zener diode 10 is substantially similar to the planar shape of the gate pad section. More specifically, the Zener diode 10 is formed as a substantially rectangular shape in planar view, which is substantially same as the gate pad section formed as a substantially rectangular shape in planar view of the gate aluminum 7.

The Zener diode 10 includes a plurality of P type regions (P type semiconductor regions) 10A and a plurality of N type regions (N type semiconductor regions) 10B. The P type regions 10A and the N type regions 10B are formed as substantially rectangular loops. Then, the P type regions 10A and the N type regions 10B are arranged around the center of the gate pad section formed as a substantially rectangular shape in plan view of the gate aluminum 7 alternately towards the outer edge of the Zener diode 10. That is, the Zener diode 10 is formed by alternately joining the P type regions 10A and the N type regions 10B.

A contact 11 is formed in the lower layer of the source aluminum 6 for connecting the source aluminum 6 and the outermost N type region 10B. The contact 11 is formed to be substantially same shape as the planar shape of the source aluminum 6 and is substantially U-shape. The contact 11 is formed by etching the interlayer film 5 under the source aluminum 6 along the edge where the source aluminum 6 opposes the gate pad section.

Moreover, a contact 12 is formed in the lower layer of the gate pad section and in the part corresponding to the innermost N type region 10B of the Zener diode 10. The contact 12 is formed to be substantially rectangular loop shape in planar view. Moreover, the contact 12 is formed by etching the interlayer film 5 under the gate pad section along the edge of the innermost N type region 10B.

As shown in FIG. 3, the epitaxial layer 1 is formed above the N+ type semiconductor substrate (not shown), which is formed with silicon etc., for example. The epitaxial layer 1 is an N type semiconductor, for example. The epitaxial layer 1 operates with the N+ type semiconductor substrate as a drain of the vertical power MOSFET 100.

The well 2 is formed above the epitaxial layer 1. The well 2 is a P type channel layer including boron, for example.

The oxide film 3 is formed above the well 2. The polysilicon layer 4 is formed above the oxide film 3.

The Zener diode 10 is formed in the polysilicon layer 4. The P type regions 10A of the Zener diode 10 are formed by an ion implantation of a P type impurity into the polysilicon layer 4. The N type regions 10B of the Zener diode 10 are formed by an ion implantation of an N type impurity into the polysilicon layer 4.

The interlayer film 5 is formed above the polysilicon layer 4. The interlayer film 5 is formed by BPSG (Boron doped Phospho-Silicate Glass) etc., for example. The contact 11 is formed in the interlayer film 5 above the outermost N type region 10B of the Zener diode 10. The contact 12 is formed in the interlayer film 5 above the innermost N type region 10B of the Zener diode 10.

The source aluminum 6 and the gate aluminum 7 are formed above the interlayer film 5. More specifically, a metal layer to be the source aluminum 6 and the gate aluminum 7 is formed above the interlayer film 5. Then, the metal layer is etched to form the source aluminum 6 and the gate aluminum 7.

The source aluminum 6 is formed above the contact 11 of the interlayer film 5. The source aluminum 6 is connected with the outermost N type region 10B of the Zener diode 10 via the contact 11.

The gate aluminum 7 is formed above the contact 12 of the interlayer film 5. The gate aluminum 7 is connected with the innermost N type region 10B of the Zener diode 10 via the contact 12.

As shown in FIGS. 1 and 3, the gate pad section extends for a predetermined distance (the distance A shown in FIG. 3) from the outermost edge of the P type region 10A of the Zener diode 10 to outside in the part where the gate pad section opposes the source aluminum 6.

It is noted that the gate pad section may only have to be formed to cover the outermost P type region 10A of the Zener diode 10. In light of process variation when forming the pattern of the gate aluminum 7, trade-off between the length to join the P type regions 10A and the N type regions 10B of the Zener diode 10 (the length hereinafter referred to as a PN junction length) and the predetermined distance, and suppression of increasing the chip size, the predetermined distance is desired to be 10 μm or less. Therefore, the predetermined distance is preferably from 0 μm to 10 μm inclusive.

The cover film 8 is formed above the source aluminum 6 and the gate aluminum 7. The cover film 8 is for example a PSG film (phosphosilicate glass film) or a SiON film (silicon oxynitride film), etc.

The polyimide 9 is formed above the cover film 8.

Figure 4:
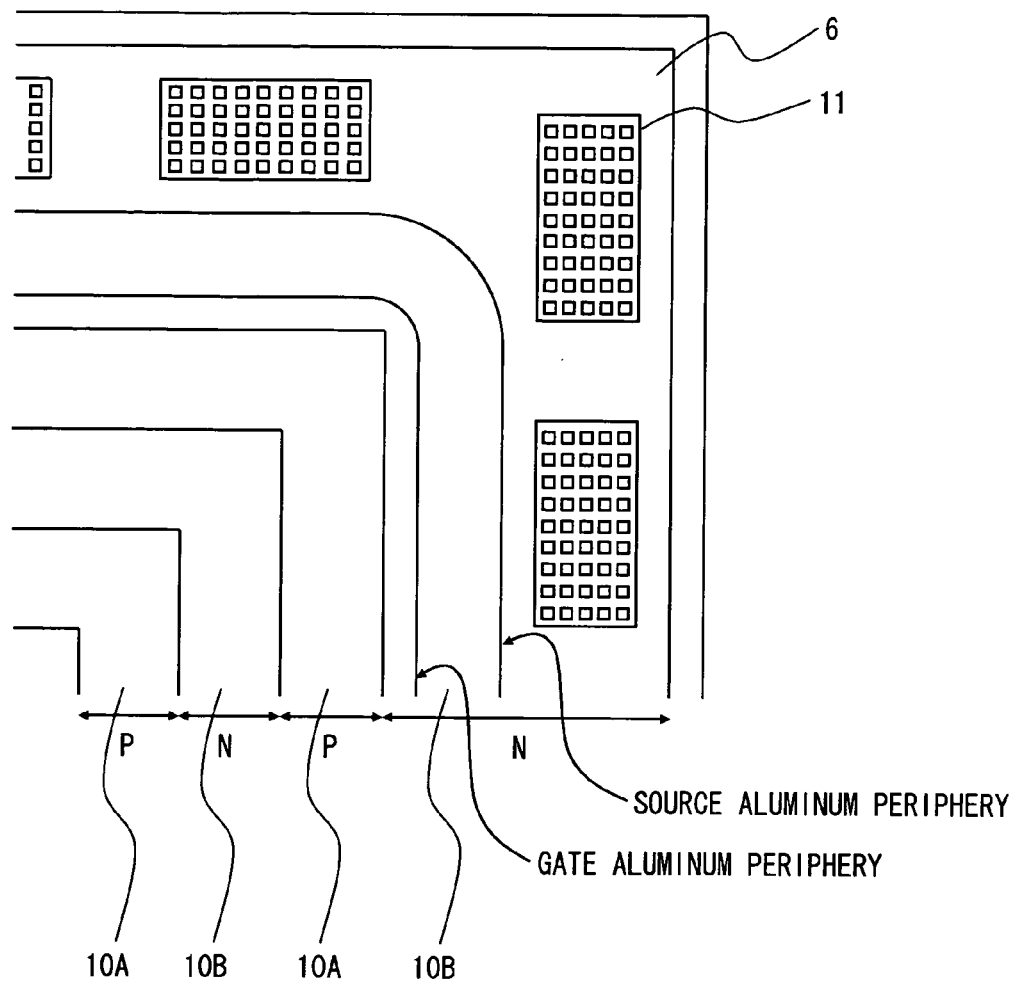
FIG. 4 is an enlarged view illustrating the section indicated by the dot-and-dash line in FIG. 1.

FIG. 4 is an enlarged view of the section indicated by the dot-and-dash line in FIG. 1. As shown in FIG. 4, the gap between the source aluminum 6 and the gate pad section is constant in the first exemplary embodiment.

The gate pad section extends for a predetermined distance from the outermost edge of the P type region 10A of the Zener diode 10 to outside in the part where the gate pad section opposes the source aluminum 6.

The contact 11 is formed in the position inside the periphery of the source aluminum 6.

As described above, in the power MOSFET 100 of the first exemplary embodiment, the planar shape of the Zener diode 10 is substantially similar to the planar shape of the gate pad section. Thus the length of the PN junction part of the Zener diode 10 is longer. This enables to further reduce the dynamic resistance of the Zener diode 10. Thus the voltage absorbing capability of the Zener diode 10 can be improved. Moreover, the electrostatic breakdown tolerance of the Zener diode 10 can be increased.

Usually in a high temperature reverse bias test, a semiconductor device is placed in a high temperature furnace and kept in the high temperature for long time, for example at 175 degrees Celsius for 168 hours or more. At this time, the gate aluminum 7 and the source aluminum 6 are kept to be 0V and a drain is kept to be positive potential. Next, the semiconductor device is taken out from the high temperature furnace, the drain and the source aluminum 6 are shorted out to be 0V. Then voltages of +20V and −20V, for example, are successively applied to the gate aluminum 7. Then, the leakage current between the gate aluminum 7 and the source aluminum 6 is measured.

There was a problem that the leakage current increases in the high temperature reverse bias test for the power MOSFET of a related art. After detailed studies, the present inventors found out the mechanism of the increase in the leakage current. The mechanism of the increase in the leakage current is illustrated in FIG. 5.

Figure 5:
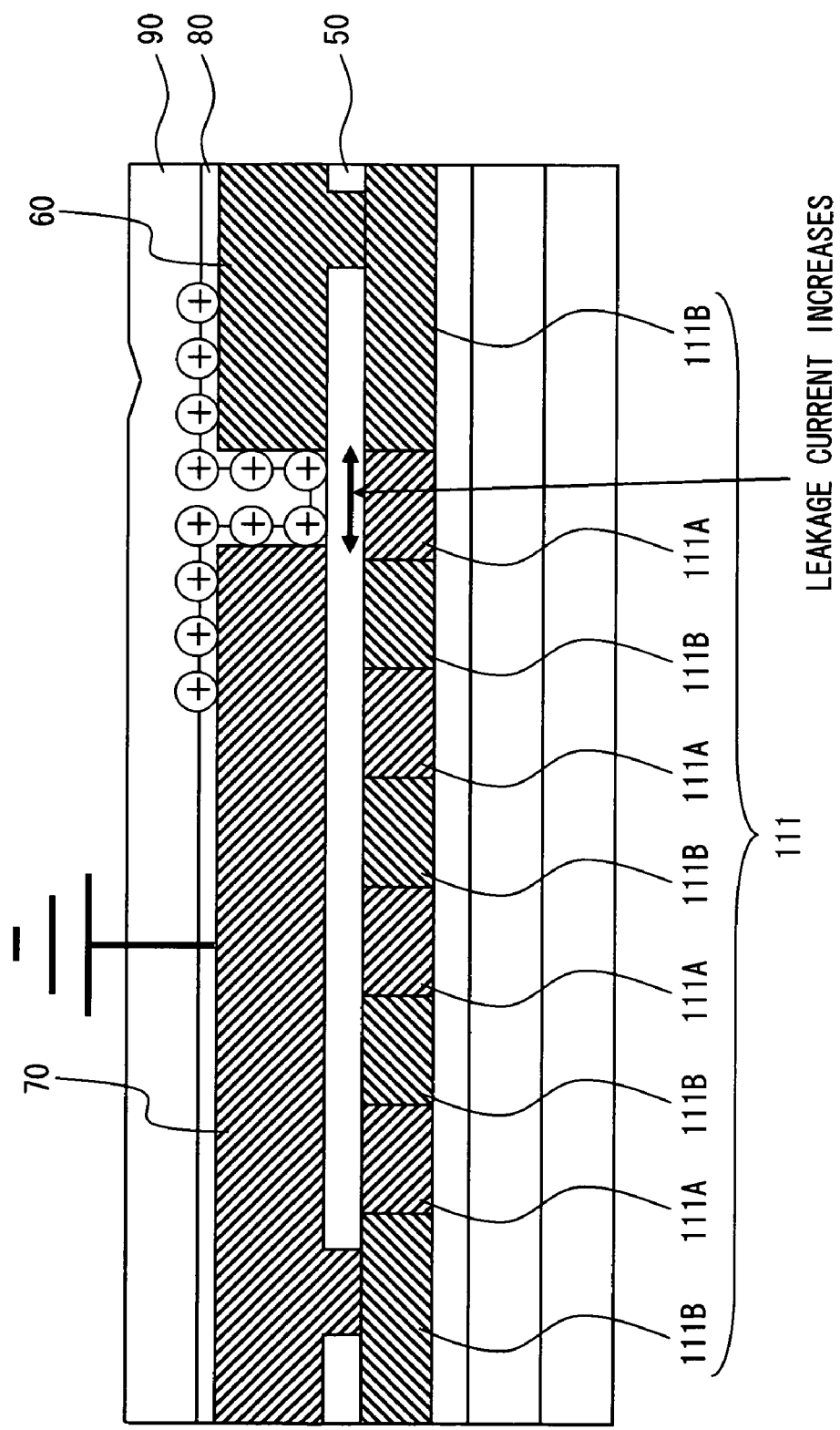
FIG. 5 explains a mechanism of an increase of a leakage current in a high temperature reverse bias test.

As shown in FIG. 5, if the source aluminum 60 and the gate aluminum 70 are 0 potential and the drain is +potential, mobile ions included in the package resin such as the polyimide 90 and the cover film 80 gather near the surface of the gate aluminum 70 and the source aluminum 60. Many of the mobile ions are cations. At this time as shown in FIG. 5, if a P type region 111A of a Zener diode 111 is exposed between a gate aluminum 70 and a source aluminum 60, cations get into the gap between the gate aluminum 70 and the source aluminum 60 to form an inversion layer over the surface of the P type region 111A via the interlayer film 50. Then, this inversion layer will be a leakage path, thereby increasing the leakage current.

However, in the power MOSFET 100 according to the first exemplary embodiment, the gate pad section extends for a predetermined distance from the outermost edge of the P type region 10A of the Zener diode 10 to outside. That is, the gate pad section covers upper part of all the P type regions 10A of the Zener diode 10. Therefore, when making the source aluminum 6 and the gate aluminum 7 to 0V and a voltage is applied to a drain in order to carry out a high temperature reverse bias test, cations got into the gap between the gate aluminum 7 and the source aluminum 6 will not form an inversion layer over the surface of the P type region 10A. This reduces the leakage current between gate and source in the high temperature reverse bias test.

Another possible structure is that the source aluminum 6 covers the outermost P type region 10A of the Zener diode 10. However in this case, the P type region 10A is exposed in the gap between the gate aluminum 7 and the source aluminum 6 in the part where the gate aluminum 7 crosses the source aluminum 6. Thus a leakage current is generated in the corresponding part. Therefore, in order to prevent the leakage current, the entire P type region 10A of the Zener diode 10 must be covered with the gate aluminum 7.

Second Exemplary Embodiment

Figure 6:
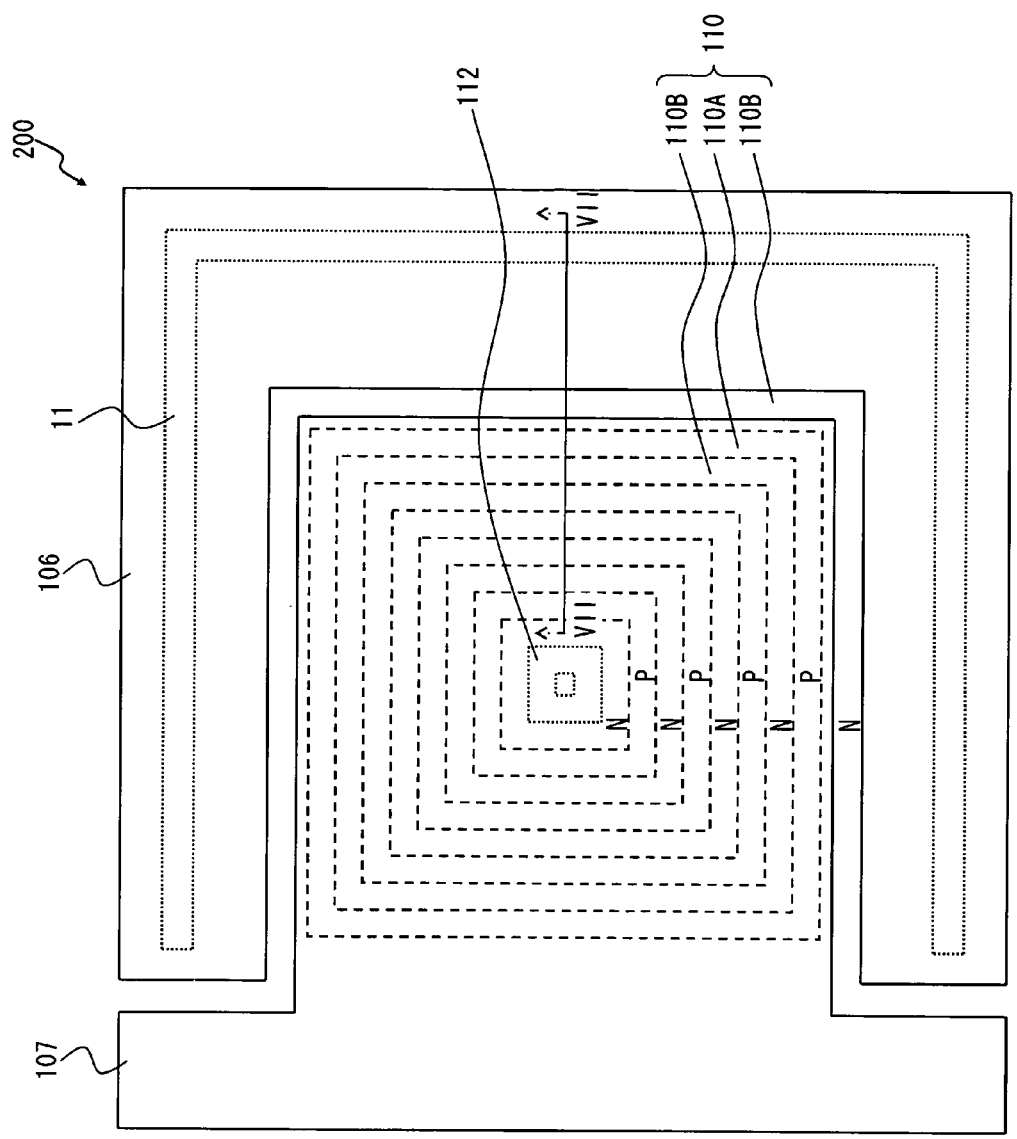
FIG. 6 is a planar view showing a power MOSFET according to a second exemplary embodiment of the present invention.
Figure 7:
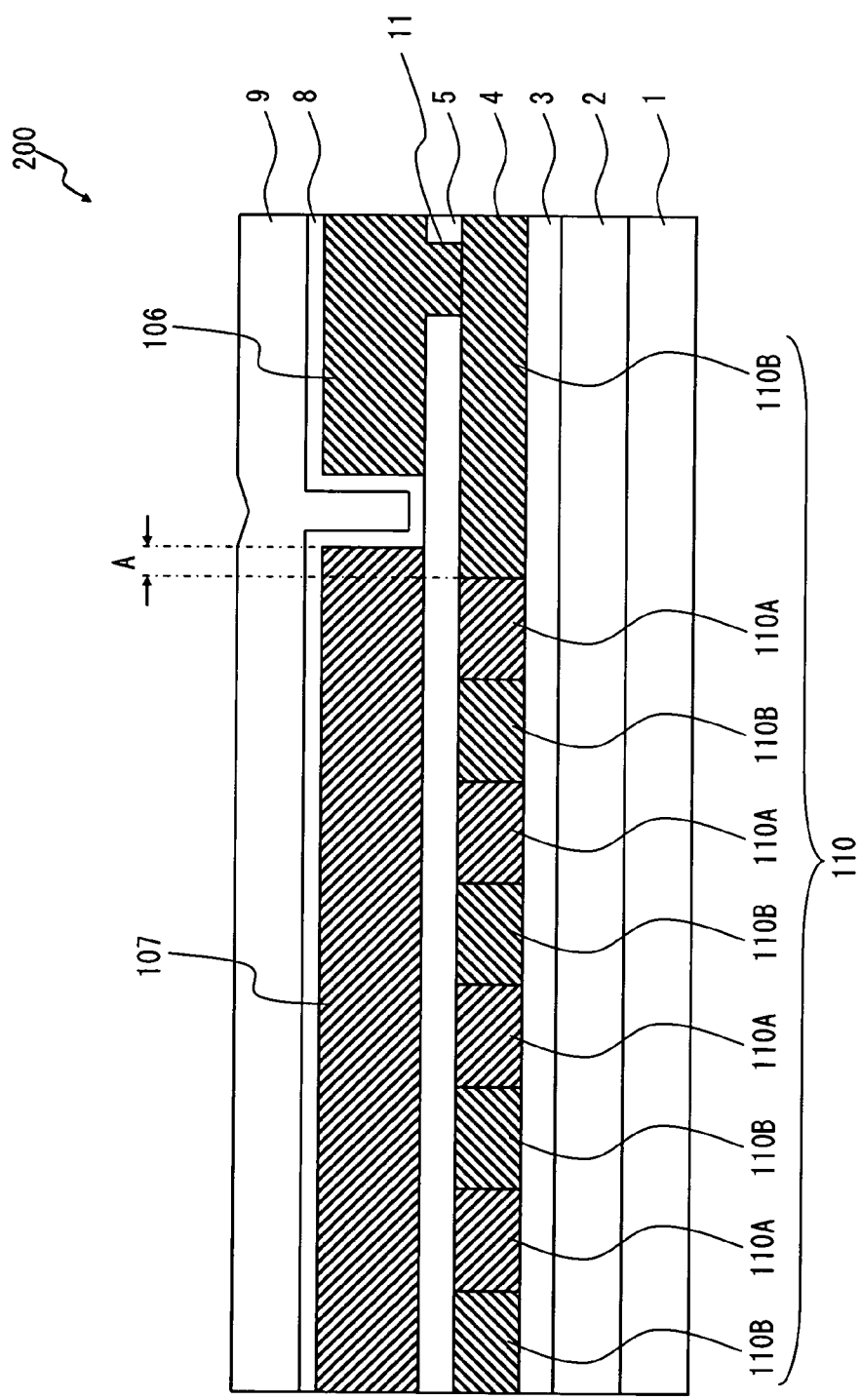
FIG. 7 is a cross-sectional view taken along the line VII-VII in FIG. 6.

FIG. 6 is a planar view of a power MOSFET 200 according to a second exemplary embodiment of the present invention. FIG. 7 is a cross-sectional view taken along the line VII-VII of FIG. 6.

As shown in FIG. 6, the power MOSFET 200 of the second exemplary embodiment is formed as a substantially rectangular shape in planar view as with the power MOSFET 100 of the first exemplary embodiment. The components other than a source aluminum 106, a gate aluminum 107, a Zener diode 110, and a contact 112 in the power MOSFET 200 are same as the power MOSFET 100. Thus they are denoted with the reference numerals and the explanation thereof is omitted.

As shown in FIG. 6, the size of the contact 112 of the power MOSFET 200 according to the second exemplary embodiment is smaller than the contact 12 of the power MOSFET 100 according to the first exemplary embodiment. Along with that, the size of the Zener diode 110 according to the second exemplary embodiment is smaller than that of the Zener diode 10 of the first exemplary embodiment. Therefore, even without largely changing the range of the gate aluminum 107 and the source aluminum 106 from the gate aluminum and the source aluminum of a related art, the gate aluminum 107 sufficiently covers over the outermost P type region 110A of the Zener diode 110.

In other words, in the power MOSFET 200, the size of the contact 112 is determined so that the gate aluminum 107 covers all of the P type regions 110A of the Zener diode 110. This enables to reduce the leakage current between gate and source in the measurement after the high temperature reverse bias test.

It is noted that aluminum is just an example of the material for the gate electrode and the source electrode and it may be other metallic materials such as aluminum alloy, copper, and copper alloy.

The first and second exemplary embodiments can be combined as desirable by one of ordinary skill in the art.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. A semiconductor device comprising:
an insulating film formed over a semiconductor substrate;
a Zener diode formed above the insulating film;
an interlayer dielectric formed above the Zener diode; and a gate electrode and a source electrode formed above the interlayer dielectric, wherein
the Zener diode is connected between the gate electrode and the source electrode,
the Zener diode is formed by alternately joining an N type semiconductor region and a P type semiconductor region concentrically, the outermost P type semiconductor region having an outermost peripheral edge,
the gate electrode includes a gate pad section,
a planar shape of the Zener diode out to the outermost peripheral edge is substantially similar to a planar shape of the gate pad section, and
the gate pad section extends for a predetermined distance beyond the outermost peripheral edge at all points of outermost peripheral edge of the outermost P type semiconductor region of the Zener diode to outside such that the gate pad section covers an upper part of all of the outermost P type semiconductor region.

2. The semiconductor device according to claim 1, wherein
the gate electrode includes the gate pad section formed as a substantially rectangular shape in planar view,
the source electrode is formed as a substantially U-shape in planar view or a substantially L-shape in planar view to surround the gate pad section, and
the gate pad section extends for the predetermined distance from the outermost peripheral edge of the outermost P type semiconductor region of the Zener diode to outside.

3. The semiconductor device according to claim 1, wherein the predetermined distance is from 0 µm to 10 µm inclusive.

4. The semiconductor device according to claim 1, wherein
the gate electrode includes the gate pad section formed as a substantially rectangular shape in planar view, and
in the Zener diode, the N type semiconductor region and the P type semiconductor region are formed as substantially rectangular loops concentrically in planar view.

5. The semiconductor device according to claim 1, further comprising a contact that connects the source electrode and an outermost N type semiconductor region of the Zener diode, the contact being formed in the interlayer dielectric,
wherein the contact is disposed along an edge of the source electrode that opposes the gate pad section.

6. The semiconductor device according to claim 1, further comprising a contact that connects the gate electrode and an innermost N type semiconductor region of the Zener diode, the contact being formed in the interlayer dielectric,
wherein the contact is disposed along an edge of the innermost N type semiconductor region.

7. The semiconductor device according to claim 1, wherein a distance between the gate pad section and the source electrode is constant.

* * * * *